United States Patent
Chen et al.

(10) Patent No.: US 8,766,309 B2
(45) Date of Patent: Jul. 1, 2014

(54) OMNIDIRECTIONAL REFLECTOR

(71) Applicant: TSMC Solid State Lighting Ltd., Hsinchu (TW)

(72) Inventors: Ding-Yuan Chen, Taichung (TW); Chen-Hua Yu, Hsinchu (TW); Wen-Chih Chiou, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/073,915

(22) Filed: Nov. 7, 2013

(65) Prior Publication Data
US 2014/0054637 A1     Feb. 27, 2014

Related U.S. Application Data

(63) Continuation of application No. 13/857,678, filed on Apr. 5, 2013, now Pat. No. 8,609,448, which is a continuation of application No. 12/202,167, filed on Aug. 29, 2008, now Pat. No. 8,415,691.

(60) Provisional application No. 61/089,796, filed on Aug. 18, 2008.

(51) Int. Cl.
*H01L 33/60* (2010.01)

(52) U.S. Cl.
USPC .......................................................... 257/98

(58) Field of Classification Search
CPC ..... B82Y 20/00; H01S 5/221; H01S 5/34333; H01S 5/423
USPC ................................................... 257/98, 603
See application file for complete search history.

(56) References Cited

U.S. PATENT DOCUMENTS

| | | | |
|---|---|---|---|
| 5,955,749 A | 9/1999 | Joannopoulos et al. |
| 6,775,314 B1 | 8/2004 | Waldrip et al. |
| 6,803,603 B1 | 10/2004 | Nitta et al. |
| 6,829,281 B2 | 12/2004 | Deng et al. |
| 6,943,377 B2 | 9/2005 | Gaska et al. |
| 7,078,736 B2 | 7/2006 | Lin et al. |
| 7,098,589 B2 | 8/2006 | Erchak et al. |
| 7,122,446 B2 | 10/2006 | Nitta et al. |

(Continued)

OTHER PUBLICATIONS

T. Sato, Photonic crystals for the visible range fabricated by autocloning technique and their application, Jan. 2002, Optical and Quantum Electronics, vol. 34, Issue 1-3, pp. 63-70.*

(Continued)

*Primary Examiner* — Zandra Smith
*Assistant Examiner* — Lawrence Tynes, Jr.
(74) *Attorney, Agent, or Firm* — Haynes and Boone, LLP

(57) ABSTRACT

A system and method for manufacturing an LED is provided. A preferred embodiment includes a substrate with a distributed Bragg reflector formed over the substrate. A photonic crystal layer is formed over the distributed Bragg reflector to collimate the light that impinges upon the distributed Bragg reflector, thereby increasing the efficiency of the distributed Bragg reflector. A first contact layer, an active layer, and a second contact layer are preferably either formed over the photonic crystal layer or alternatively attached to the photonic crystal layer.

20 Claims, 5 Drawing Sheets

(56) References Cited

U.S. PATENT DOCUMENTS

| | | |
|---|---|---|
| 7,367,691 B2 | 5/2008 | Lin |
| 7,509,012 B2 | 3/2009 | Zoorob et al. |
| 7,628,906 B2 | 12/2009 | Kochergin et al. |
| 2003/0235229 A1* | 12/2003 | Deng et al. ............... 372/96 |
| 2004/0252509 A1* | 12/2004 | Lin .............................. 362/293 |
| 2005/0199510 A1* | 9/2005 | Kochergin et al. ........... 205/640 |

OTHER PUBLICATIONS

Sato et. al., "Photonic crystals for the visible range fabricated by autocloning technique and their application", 2002, Optical and Quantum Electronics 34, pp. 63-70.

Fink, Y., et. al. "A Dielectric Omnidirectional Reflector," Science Magazine, Nov. 27, 1998, pp. 1679-1682, vol. 282.

Kosaka et al., "Self-Collimating Phenomena in Photonic Crystals" Applied Physics Letters 74, 1999.

\* cited by examiner

US 8,766,309 B2

OMNIDIRECTIONAL REFLECTOR

PRIORITY DATA

This application is a continuation patent application of U.S. patent application Ser. No. 13/857,678, filed on Apr. 5, 2013, and entitled "Omnidirectional Reflector", which is a continuation patent application of U.S. patent application Ser. No. 12/202,167, filed Aug. 29, 2008, and entitled "Omnidirectional Reflector," which claims priority to Provisional Patent Application No. 61/089,796, filed Aug. 18, 2008, and entitled "Omnidirectional Reflector," the disclosures of each of which are hereby incorporated by reference in their entirety.

TECHNICAL FIELD

The present invention relates generally to a system and method for manufacturing an omnidirectional reflector and, more particularly, to a system and method for forming an omnidirectional reflector in relation to a light-emitting diode (LED).

BACKGROUND

A light-emitting diode (LED) is generally formed of a first contact layer, an active layer, and a second contact layer that form a diode that will generate light when it is forward-biased. When generated, this light will generally propagate outwards in all directions from the active layer. In most cases, however, it is desired to direct the light in a very specific direction, which, without any type of reflector, would only receive a small portion of the total light emitted by the LED. Additionally, if the LED is formed on a light-absorbing substrate such as silicon, the light that propagates towards the substrate may be absorbed by the substrate and be mostly lost rather than merely going in an undesired direction. Generally, when this occurs, less than about 10% of the light would get reflected when the light impacts a silicon substrate.

To combat these problems, reflectors have been formed as part of the LED in order to direct the light in a desired direction and away from any light-absorbing substrates. One typical reflector is a distributed Bragg reflector (DBR), which uses alternating layers of materials having different refractive indices to reflect the emitted light. While a DBR is helpful, however, it is not omnidirectional, as the reflectivity of the DBR drops when the angle of incidence of the light impacting the DBR increases relative to normal to the surface of the DBR. This drop in the efficiency of the DBR causes a corresponding drop in efficiency of the LED.

Accordingly, what is needed is a reflector that has a greater efficiency for a larger range of incident angles.

SUMMARY OF THE INVENTION

These and other problems are generally solved or circumvented, and technical advantages are generally achieved, by preferred embodiments of the present invention which provide for an omnidirectional reflector incorporated with a light-emitting diode (LED).

In accordance with a preferred embodiment of the present invention, a light-generating device comprises a substrate with a reflective layer over the substrate. A two-dimensional photonic crystal layer is located over the reflective layer, and an LED is located over the photonic crystal layer.

In accordance with another preferred embodiment of the present invention, a light-generating device also comprises a substrate with a reflective layer over the substrate. A collimator is located over the reflective layer, and an LED is located over the collimator. The LED comprises a first contact layer, an active layer over the first contact layer, and a second contact layer over the first contact layer.

In accordance with yet another preferred embodiment of the present invention, a light-emitting device comprises a substrate with a light-emitting diode over the substrate. A reflector is located between the light-emitting diode and the substrate, and the reflector comprises a reflective layer and a photonic crystal layer.

An advantage of a preferred embodiment of the present invention is an increase in the efficiency of light reflected by the reflective layer, which causes an overall increase in efficiency of the LED in general.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a light-emitting diode (LED) with an omnidirectional reflector. The invention may also be applied, however, to other reflective layers.

Figure 1A:
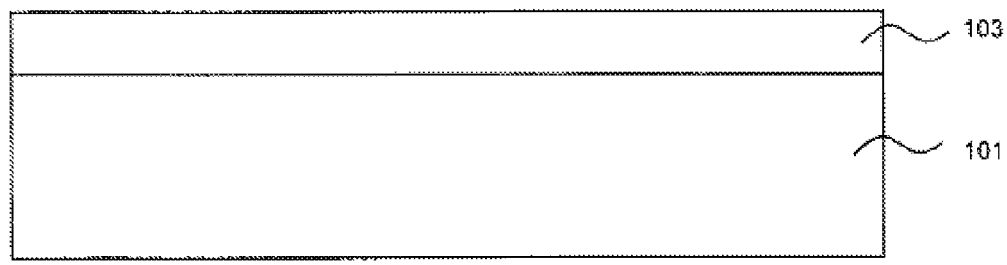
FIGS. 1A-1D illustrate steps in the manufacturing of a photonic crystal layer over a reflective layer in accordance with an embodiment of the present invention.

With reference now to FIG. 1A, there is shown a first substrate 101 with a reflective layer 103 formed over the first substrate 101. The first substrate 101 is preferably a sapphire or semiconductor substrate. It should be noted that while embodiments of the present invention are described in the context of using a sapphire or silicon substrate, other substrates may be used. For example, silicon-on-insulator (SOI) substrates, SiC substrates, $MgAl_2O_4$ substrates, and the like may also be used. Embodiments of the present invention, however, may be particularly suited to silicon substrates due to the low cost in addition to reducing the residual stress in the LED structure formed thereon. Furthermore, while a substrate having a (111) surface orientation is preferred, substrates having a different surface orientation, such as a (100) or (110) surface orientation, may also be used.

The reflective layer 103 is preferably formed over the first substrate 101 in order to reflect light from an LED that will be formed over the reflective layer 103 in subsequent processing steps (described below with reference to FIG. 1D). The reflective layer 103 is preferably a DBR formed to reflect light away from the direction of the first substrate 101, and works highly efficiently when the light impacts the reflective layer 103 at relatively large angles of incidence (angles close to 90.degree. relative to the surface of the DBR). When light impacts the reflective layer 103 at smaller incident angles (e.g., smaller than about 80.degree.), however, the efficiency of the reflective layer 103 is reduced.

The reflective layer 103 preferably comprises a stack of alternating materials with alternating high and low refractive indices in order to capture and reflect incident light. For example, the reflective layer 103 preferably comprises an alternating stack of dielectric materials such as titanium oxide, GaN, AlGaN, $In_y(Ga_xAl_{1-x})_{1-y}$, $In_yAl_{1-y}P$, silicon dioxide, or the like. Furthermore, the reflective layer 103 may be made of metallic or non-metallic materials. When the two layers have a large difference of refractive indices (such as, for example, 20%), the reflective layer 103 may comprise as few as five sets of alternating layers of material. However, if the difference in the refractive indices between the two materials is small (such as, for example, 2%), the reflective layer 103 may require as many as twenty sets of alternating layers of material. Preferably, the reflective layer 103 comprises about 10 sets of alternating layers of materials.

The reflective layer 103 is preferably formed, for example, through a chemical vapor deposition (CVD) process or an epitaxial growth process such as molecular beam epitaxy (MBE), although other processes, such as metal organic chemical vapor deposition (MOCVD), hydride vapor phase epitaxy (HVPE), liquid phase epitaxy (LPE), or the like, may alternatively be utilized. Additionally, while the thickness of each layer is dependent upon multiple design constraints, the thickness of each layer is preferably determined based upon the wavelength of light that is desired to be reflected and the refractive index of the material. For example, if light with a wavelength of about 480 nm is desired to be reflected off a layer of GaN, with a refractive index of 2.5, the thickness of the layer of GaN would preferably be the wavelength divided by four times the refractive index, or 48 nm.

As one of ordinary skill in the art will recognize, the reflective layer 103 described above is merely illustrative of the materials, methods, and dimensions that may be used for the reflective layer 103. Other materials, such as alternating layers of $Al_xGa_{1-x}$ and $Al_xGa_xAs$ and other processes, such as metal organic chemical vapor deposition (MOCVD), may alternatively be used to form the reflective layer 103. Further, the number of alternating layers may be more or fewer than those described above, as required by the overall design. Any methods, materials, and dimensions that may be used to form the reflective layer 103 are also functional with the present invention and are fully intended to be included within the scope of the present invention.

Figure 1B:
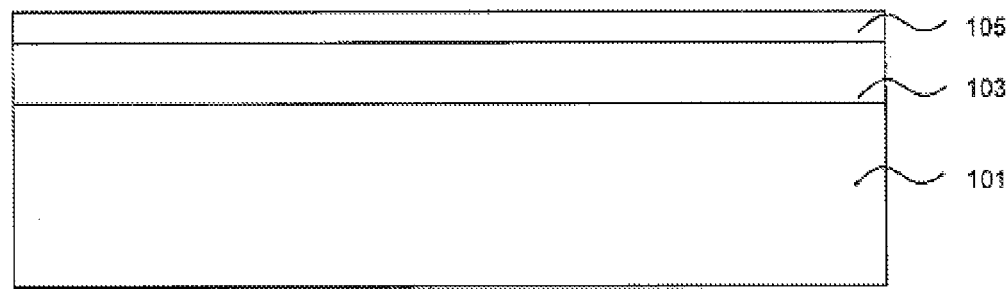

FIG. 1B illustrates the formation of a photonic crystal layer 105 over the reflective layer 103. The photonic crystal layer 105 preferably reflects light in two dimensions (for example, an X-Y plane substantially parallel with the first substrate 101) while allowing the light to travel unreflected in a third dimension (for example, a Z direction substantially perpendicular to the first substrate 101). By reflecting light in two dimensions but not a third, the photonic crystal layer 105 collimates the light generated by an LED structure 107 (formed over the photonic crystal layer 105 as described below with reference to FIG. 1D) so that emitted light that otherwise would have impacted the reflective layer 103 at inefficient angles, are directed at nearly right angles to the reflective layer 103. This directing of the light increases the efficiency of the reflective layer 103, and can lead directly to an overall increase of light in a desired direction.

Figure 1C:
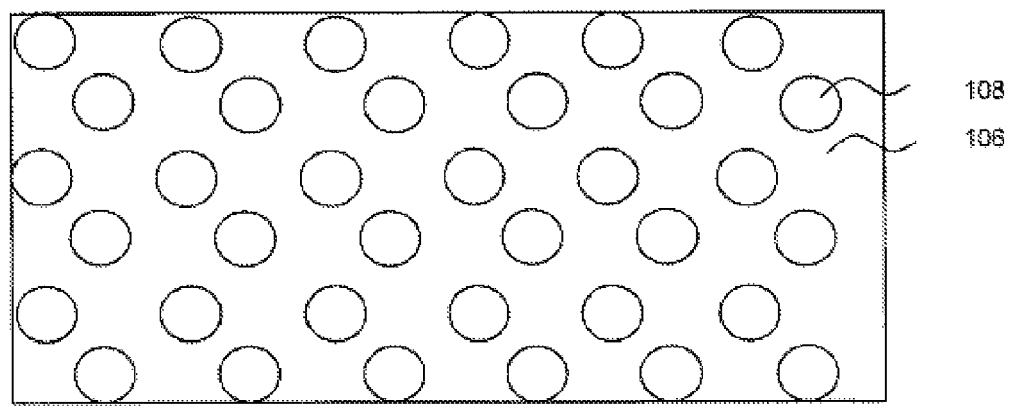

FIG. 1C illustrates a plan view of the photonic crystal layer 105, which is preferably formed of a base material 106 and a lattice of dielectric material 108. The base material 106 preferably comprises GaN formed through a deposition process such as MOCVD, although other materials, such as AlGaN or silicon, and other processes, such as hydride vapor phase epitaxy (HVPE), liquid phase epitaxy (LPE), or the like, may alternatively be utilized. The base material 106 is preferably formed to a thickness of between about 10 nm and about 5000 nm, with a preferred thickness of about 1000 nm.

Once a layer of the base material 106 has been formed, the lattice of dielectric material 108 is preferably formed in the base material 106. The lattice of dielectric material 108 is formed so that the photonic crystal layer 105 is homogenous with respect to one direction (for example, the Z direction substantially perpendicular to the first substrate 101), while also being non-homogenous in two separate directions (for example, the X and Y directions substantially parallel with the first substrate 101). This non-homogeneity causes the photonic crystal layer 105 to reflect light in the two non-homogenous directions, while not reflecting the light in the homogenous direction, essentially collimating light in the Z direction.

The lattice of dielectric material 108 preferably comprises a plurality of columns formed within the base material 106 in a repeating lattice pattern. The individual areas of dielectric material are preferably circular in shape (when looked at in a plan view as in FIG. 1C), although any suitable shape, such as rectangular, square, hexagonal, triangular, honeycomb, or the like, may alternatively be used, and are preferably spaced to have a pitch of between about 10 nm and about 1000 nm, with a preferred pitch of about 500 nm. Further, the lattice of dielectric material 108 preferably extends all the way through the base material 106, but may alternatively extend only part of the way through the base material 106, depending upon the overall design of the photonic crystal layer 105.

The lattice of dielectric material 108 preferably comprises a dielectric material that possesses a refractive index different from that of the base material 106, such as air, silicon dioxide, titanium dioxide, GaN, AlGaN, or the like. The lattice of dielectric material 108 is preferably formed by initially forming a lattice of openings through the base material 106 using a suitable photolithographic process to mask the base material 106 and expose portions of the base material 106 in the desired shapes of the lattice of dielectric material 108. Once the base material 106 has been masked, the base material 106 is then etched to remove portions of the base material 106 to form the lattice of openings. The lattice of openings is then preferably overfilled with a process such as MBE, HPVE, LPE, CVD, PVD, or the like, and then excess material may be removed through a grinding or etching process, for example. Alternatively, the lattice of openings may be left open so as to fill the openings with air.

Figure 1D:
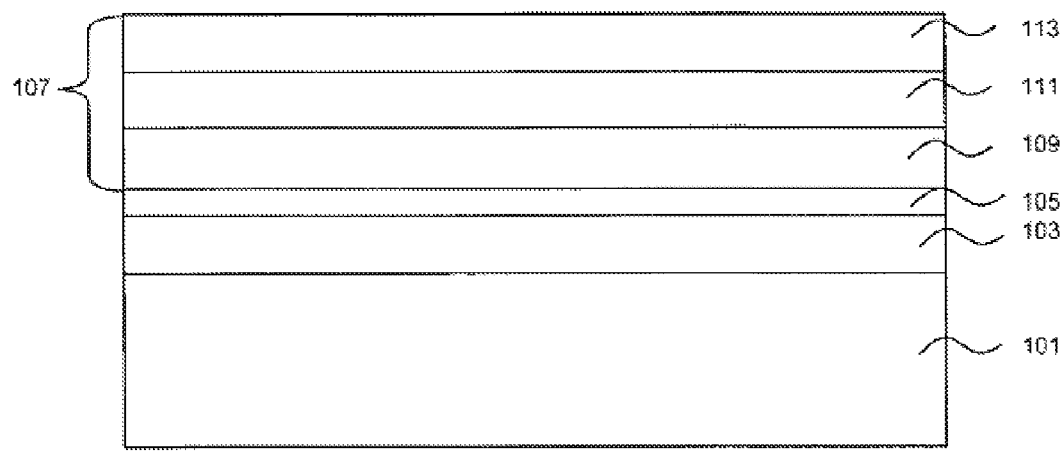

FIG. 1D illustrates the formation of an LED structure 107 over the photonic crystal layer 105. The LED structure 107 is preferably formed of a first contact layer 109, an active layer 111, and a second contact layer 113. The first contact layer 109 preferably forms one part of the diode required to emit light, and preferably comprises a group III-V compound. As the name implies, group III-V compounds comprise a group III element and a group V element and include compounds such as GaN, InN, AlN, $Al_xGa_{(1-x)}N$, $Al_xIn_{(1-x)}N$, $Al_{(1-x-y)}N$, combinations thereof, or the like, doped with a dopant of a first conductivity type (e.g., n-GaN).

The first contact layer 109 is preferably formed, for example, through an epitaxial growth process such as MBE, although other processes, such as HVPE, LPE, or the like, may alternatively be utilized. The first contact layer 109 is preferably formed to have a thickness of between about 1 um and about 6 um, with a preferred thickness of about 2 um. The first contact layer 109 is preferably doped in situ during formation to a concentration of between about $1\times10^{16}$ cm$^{-3}$ and about $1\times10^{19}$ cm$^{-3}$, with a preferred dopant concentration of about $1\times10^{18}$ cm$^{-3}$, although other processes, such as ion implantation or diffusion, may alternatively be utilized.

The active layer 111 is preferably formed over the first contact layer 109. The active layer 111 is designed, among other things, to control the generation of light to desired wavelengths. For example, by adjusting and controlling the proportional composition of the elements in the active layer 111, the bandgap of the materials in the active layer 111 may be adjusted, thereby adjusting the wavelength of light that will be emitted by the LED structure 107.

Active layer 111 preferably comprises multiple quantum wells (MQWs). MQW structures in active layer 111 may comprise, for example, layers of InGaN, GaN, $Al_xIn_y Ga_{(1-x-y)}N$ (where $0<=x<=1$), or the like. The active layer 111 may comprise any number of quantum wells, 5 to 20 quantum wells for example, each preferably about 30 Å to about 100 Å thick. The MQWs are preferably epitaxially grown using the first contact layer 109 as a nucleation layer using MOCVD, although other processes, such as MBE, HYPE, LPE, or the like, may alternatively be utilized.

The second contact layer 113 is preferably formed over the active layer 111. The second contact layer 113 preferably forms the second part of the diode required to emit light in conjunction with the first contact layer 109. The second contact layer 113 preferably comprises a group III-V compound such as GaN, InN, AlN, $Al_xGa_{(1-x)}N$, $Al_xIn_{(1-x)}N$, $Al_{(1-x-y)}N$, combinations thereof, or the like, doped with a dopant of a second conductivity type (e.g., p-GaN) opposite the first conductivity type in the first contact layer 109.

The second contact layer 113 is preferably formed, for example, through an epitaxial growth process such as MBE. Other processes, however, such as HYPE, LPE, MOCVD, or the like, may alternatively be utilized. The second contact layer 113 is preferably formed to have a thickness of between about 0.1 um and about 2 um, with a preferred thickness of about 0.3 um and is preferably doped in situ to a concentration of between about $1\times10^{17}$ cm$^{-3}$ and about $1\times10^{21}$ cm$^{-3}$, with a preferred dopant concentration of about $1\times10^{19}$ cm$^{-3}$, although other processes, such as ion implantation or diffusion may alternatively be utilized.

By forming the photonic crystal layer 105 over the reflective layer 103, an omnidirectional reflector is formed. This omnidirectional reflector works to collimate light emitted from the LED structure 107 that otherwise would have impacted the reflective layer 103 at larger angles of incident (relative to normal to the surface of the reflective layer 103) to instead impact the reflective layer 103 at a smaller angle of incident. Accordingly, the reflective layer 103 will reflect more of the impacting light emitted by the LED structure 107, thereby increasing the amount of light leaving the LED structure 107 in a desired direction.

Figure 2A:
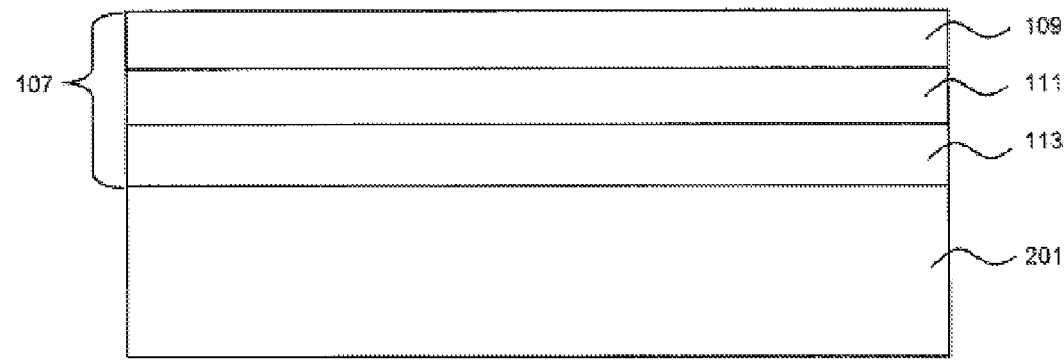
FIGS. 2A-2C illustrate steps in manufacturing a photonic crystal layer over a reflective layer attached to a light-emitting diode (LED) in accordance with an embodiment of the present invention.

FIG. 2A illustrates an alternative embodiment of the present invention in which the LED structure 107 is formed on a second substrate 201 and then attached to the structure of FIG. 1B. This embodiment is especially well suited when the photonic crystal layer 105 is formed from a material, such as silicon dioxide, that is not readily usable as a seed layer for further epitaxial growth. In this embodiment, the second substrate 201 is preferably similar to the first substrate 101, and preferably comprises similar materials. Alternatively, the second substrate 201 may comprise structures and materials that are different from the first substrate 101, and both embodiments are intended to be included within the scope of the present invention.

The first contact layer 109, the active layer 111, and the second contact layer 113 are preferably formed using similar processes and materials to those described above with reference to FIG. 1D. In this embodiment, however, the order of formation of these layers on the substrate is preferably reversed. For example, in an embodiment to form the LED structure 107 as a p-up LED, the p-conductive second contact layer 113 is preferably formed on the second substrate 201, the active layer 111 is preferably formed over the second contact layer 113, and the n-conductive first contact layer 109 is preferably formed over the active layer 111. Using this method, when the structures on the first substrate 101 and the second substrate 201 are bonded together, the p-conductive second contact layer 113 will be furthest from the first substrate 101, forming a p-up LED structure 107.

Figure 2B:
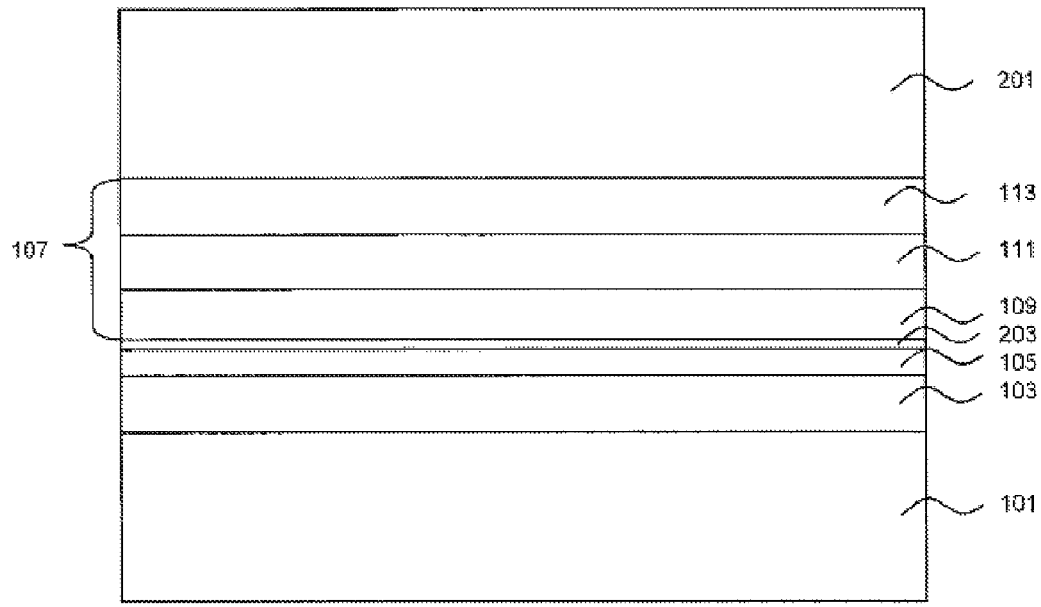

FIG. 2B illustrates the bonding of the first contact layer 109 on the second substrate 201 to the photonic crystal layer 105 on the first substrate 101. The first contact layer 109 and the photonic crystal layer 105 are preferably bonded using a metal-metal bond, wherein a thin layer of a metal (not shown) such as nickel, gold, or the like is formed on both the photonic crystal layer 105 and the first contact layer 109. The thin metal layers are preferably formed using a process such as PVD or CVD and preferably have a thickness of between about 5 nm and about 500 nm, with a preferred thickness of about 100 nm. Once formed, the thin metal layers are then preferably heated to a temperature of between about 200.degree. C. and about 1000.degree. C., with a preferred temperature of about 400.degree. C., in order to form a single metal layer 203 that bonds the first contact layer 109 to the photonic crystal layer 105.

Figure 2C:
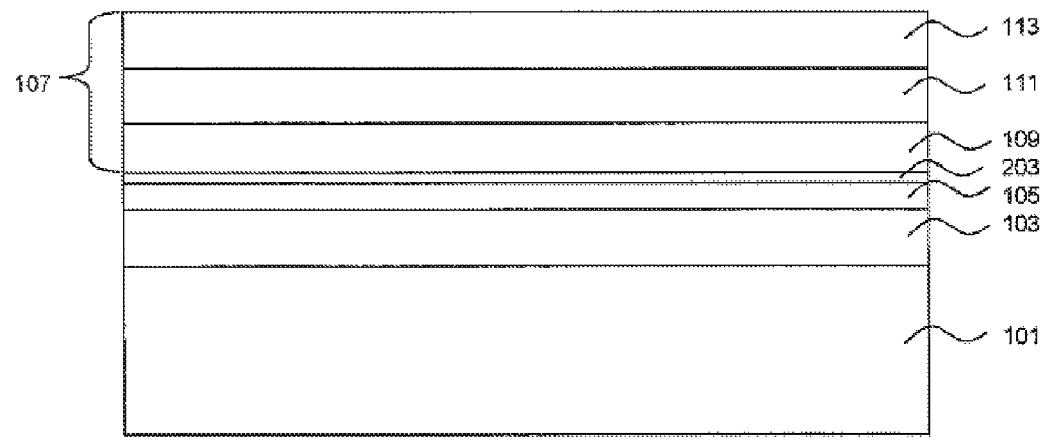

FIG. 2C illustrates the removal of the second substrate 201 to expose the LED structure 107 after the bonding of the first contact layer 109 and the photonic crystal layer 105. The second substrate 201 is preferably removed using either mechanical processes such as chemical mechanical polishing (CMP) and water jets or else chemical processes such as etching in order to expose the second contact layer 113. Other suitable processes, however, or combination of processes, may alternatively be used to remove the second substrate 201 after bonding.

Figure 3A:
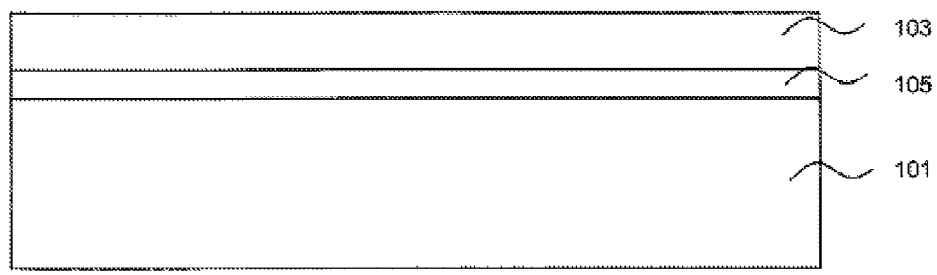
FIGS. 3A-3B illustrate steps in manufacturing a reflective layer over a photonic crystal layer in accordance with an embodiment of the present invention.

FIG. 3A illustrates yet another preferred embodiment of the present invention in which the photonic crystal layer 105 is preferably formed on the first substrate 101 and the reflective layer 103 is preferably formed over the photonic crystal layer 105. In this embodiment the photonic crystal layer 105 is preferably formed on the first substrate 101 using similar materials and processes as described above with respect to FIGS. 1B-1C (e.g., a base material with a lattice of dielectric material). Once the photonic crystal layer 105 has been formed, the reflective layer 103 is preferably formed over the photonic crystal layer 105 using similar processes and materials as described above with reference to FIG. 1A (e.g., a DBR formed with alternating layers of material). By forming the reflective layer 103 over the photonic crystal layer 105, light impinging upon the reflective layer 103 from the direction of the first substrate 101 may be collimated and reflected by the photonic crystal layer 105 and the reflective layer 103.

Figure 3B:
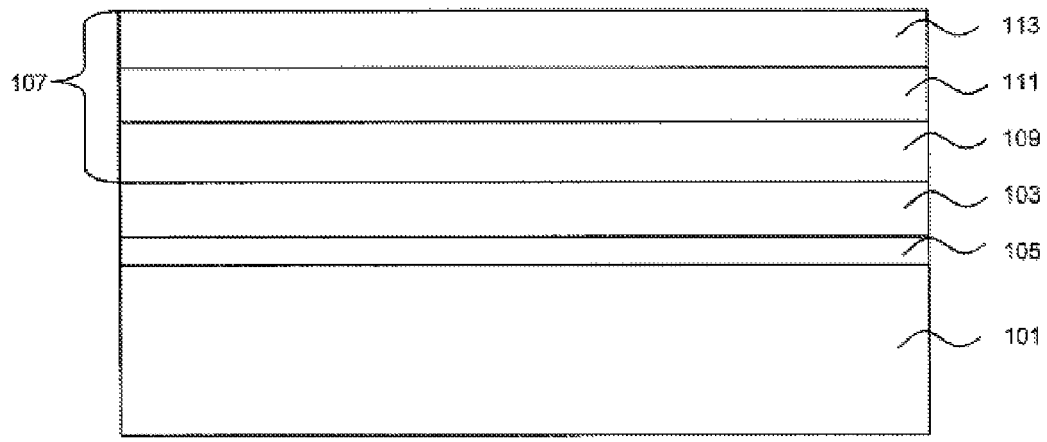

FIG. 3B illustrates the formation of an LED structure 107 over the reflective layer 103 and separated from the photonic crystal layer 105. The LED structure 107 in this embodiment preferably comprises a first contact layer 109, an active layer 111, and a second contact layer 113, similar to the LED structure 107 described above with reference to FIG. 1D. The LED structure 107 is preferably formed as a p-up LED structure 107 with an n-doped first contact layer 109 and a p-doped second contact layer 113, and the first contact layer 109, the active layer 111, and the second contact layer 113 are preferably formed with processes and materials as described above with reference to FIG. 1D.

Figure 4A:
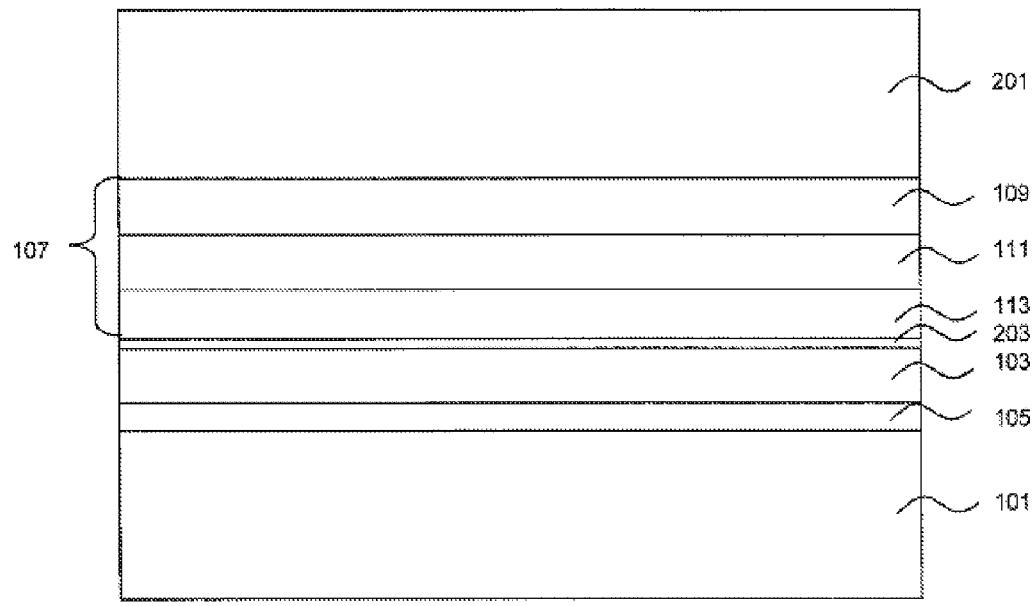
FIGS. 4A-4B illustrate steps in manufacturing a reflective layer over a photonic crystal layer attached to an LED in accordance with an embodiment of the present invention.

FIG. 4A illustrates yet another preferred embodiment of the present invention in which the photonic crystal layer 105 is also preferably formed on the substrate 101 and the reflective layer 103 is preferably formed over the photonic crystal layer 105. In this embodiment, however, the LED structure 107 is not formed over the reflective layer 103, but is instead formed on a second substrate 201 and then bonded to the photonic crystal layer 105 in a similar fashion as described above with respect to FIG. 2B (e.g., metal-metal bonding to form a metal bonding layer 203).

Figure 4B:
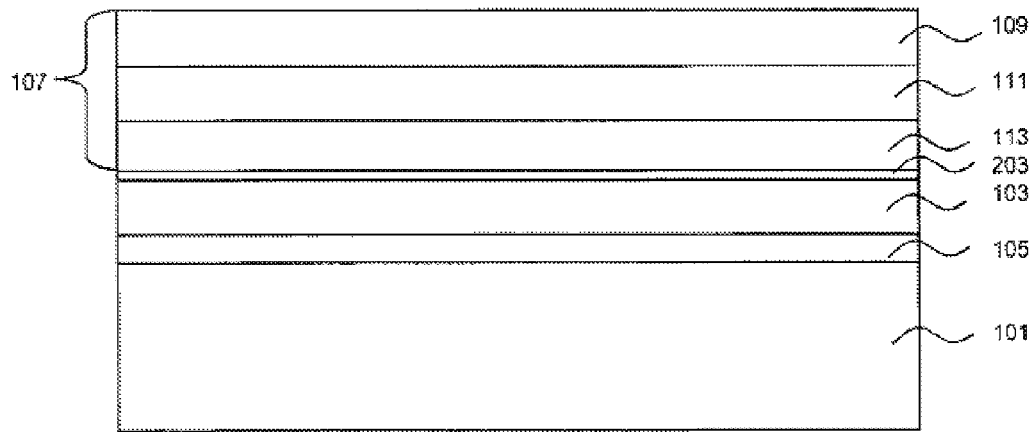

FIG. 4B illustrates the removal of the second substrate 201 after the LED structure 107 has been attached to the reflective layer 103. The second substrate 201 in this embodiment is preferably removed using a grinding or etching process as described above with reference to FIG. 2C. This removal of the second substrate 201 preferably exposes the top surface of the LED structure 107 for further processing.

Once the embodiments described herein have been performed, more processing may be performed to complete the LED device. For example, electrical contacts (front-side and/or back-side contacts) may be formed to the first and second contact layers 109 and 113, respectively, passivation layers may be formed, and the LED device may be diced and packaged.

It should also be noted that the above description describes a method of forming LEDs with an omnidirectional reflector. Other layers, such as a buffer layer, may also be desirable depending upon the type of substrate and the connections to the first and second contact layers 109 and 113, respectively. For example, with some types of substrates, such as SiC and Si substrates, a buffer layer, such as AlN or AlGaN, may be desirable to aid in the epitaxial growth of a group III-N compound on the SiC substrate.

The LED structure 107 may also vary depending on the type of materials used and the intended application. It is expected that many types of LED structures may be used with embodiments of the present invention, which provides an omnidirectional reflector used with an LED.

Although the present invention and its advantages have been described in detail, it should be understood that various changes, substitutions and alterations can be made herein without departing from the spirit and scope of the invention as defined by the appended claims. For example, instead of forming a p-up LED, an n-up LED may alternatively be used with the present invention. As another example, it will be readily understood by those skilled in the art that processes and materials may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device, comprising:
a substrate;
a light-reflective layer disposed over the substrate;
a photonic crystal layer disposed over the substrate, the photonic crystal layer being configured to reflect light in a plane substantially parallel with the substrate while allowing light to travel unreflected in a direction substantially perpendicular to the substrate; and
a light-emitting diode (LED) disposed over the substrate, wherein the LED includes a light-emitting layer disposed between two doped layers having different types of conductivity, and wherein the light-reflective layer and the photonic crystal layer are disposed between the substrate and the LED.

2. The device of claim 1, wherein the light-reflective layer includes a stack of layers with alternating higher and lower reflective indices.

3. The device of claim 2, wherein the light-reflective layer includes a Distributed Bragg Reflector.

4. The device of claim 1, wherein the photonic crystal layer includes a base layer and a plurality of dielectric elements disposed in the base layer, and wherein the base layer and the plurality of dielectric elements have different refractive indices.

5. The device of claim 4, wherein:
the base layer includes a gallium nitride material; and
the dielectric elements include air, silicon dioxide, titanium dioxide, and aluminum gallium nitride.

6. The device of claim 4, wherein:
the photonic crystal layer is homogeneous with respect to the direction substantially perpendicular to the substrate; and
the photonic crystal layer is non-homogeneous with respect to a first direction and a second direction that collectively define the plane substantially parallel with the substrate.

7. The device of claim 4, wherein the plurality of dielectric elements are configured as a plurality of circular columns formed in a repeating lattice pattern.

8. The device of claim 1, wherein the light-reflective layer is disposed between the substrate and the photonic crystal layer.

9. The device of claim 1, wherein the photonic crystal layer is disposed between the substrate and the light-reflective layer.

10. The device of claim 1, wherein the LED is bonded to one of the light-reflective layer and the photonic crystal layer through a single metal layer.

11. The device of claim 1, wherein the substrate is a sapphire substrate.

12. A device, comprising:
a substrate;
a light-reflective layer disposed over the substrate, wherein the light-reflective layer includes a stack of layers with alternatingly high and low refractive index values;

a photonic crystal layer disposed over the substrate, the photonic crystal layer including a base layer and a plurality of columns embedded in the base layer, wherein the columns have a repeating lattice pattern, and wherein the columns have different refractive index values than the base layer, and wherein the photonic crystal layer is homogeneous with respect to a vertical direction perpendicular to the substrate and non-homogeneous with respect to a first horizontal direction and a second horizontal direction parallel with the substrate; and a light-emitting diode (LED) disposed over the substrate, wherein the LED includes a light-emitting layer disposed between two doped layers having different types of conductivity, and wherein the light-reflective layer and the photonic crystal layer are disposed between the substrate and the LED.

13. The device of claim 12, wherein the light-reflective layer includes a Distributed Bragg Reflector.

14. The device of claim 12, wherein:
the base layer includes a gallium nitride material; and
the dielectric elements include air, silicon dioxide, titanium dioxide, and aluminum gallium nitride.

15. The device of claim 12, wherein the light-reflective layer is disposed between the substrate and the photonic crystal layer.

16. The device of claim 12, wherein the photonic crystal layer is disposed between the substrate and the light-reflective layer.

17. The device of claim 12, wherein the LED is bonded to one of the light-reflective layer and the photonic crystal layer through a single metal layer.

18. A device, comprising:
a substrate;
a Distributed Bragg Reflector (DBR) structure disposed over the substrate;
a photonic crystal layer disposed over the substrate, the photonic crystal layer including a gallium nitride base layer and a lattice structure having a repeating pattern of columns disposed in the gallium nitride layer, wherein the columns contain air, silicon dioxide, titanium dioxide, or aluminum gallium nitride, and wherein the photonic crystal layer is homogeneous with respect to a first direction perpendicular to the substrate and non-homogeneous with respect to a second direction and a third direction that collectively define a plane parallel with an upper surface of the substrate; and
a light-emitting diode (LED) disposed over the substrate, wherein the LED includes a light-emitting layer disposed between two doped layers having different types of conductivity, and wherein the DBR structure and the photonic crystal layer are disposed between the substrate and the LED.

19. The device of claim 18, wherein the DBR structure is disposed between the substrate and the photonic crystal layer.

20. The device of claim 18, wherein the photonic crystal layer is disposed between the substrate and the DBR structure.

* * * * *